(12) United States Patent
Zhang et al.

(10) Patent No.: US 11,579,214 B2
(45) Date of Patent: Feb. 14, 2023

(54) CABLE CONDITION MONITORING SENSOR DEVICE METHOD

(71) Applicant: Tsinghua University, Beijing (CN)

(72) Inventors: Pinjia Zhang, Beijing (CN); Yang Wu, Beijing (CN)

(73) Assignee: Tsinghua University, Beijing (CN)

( * ) Notice: Subject to any disclaimer, the term of this patent is extended or adjusted under 35 U.S.C. 154(b) by 356 days.

(21) Appl. No.: 16/850,852

(22) Filed: Apr. 16, 2020

(65) Prior Publication Data
US 2020/0241087 A1 Jul. 30, 2020

(30) Foreign Application Priority Data

Oct. 15, 2019 (CN) .......................... 201910976500.1

(51) Int. Cl.
*G01R 1/18* (2006.01)
*G01R 33/09* (2006.01)
*G01R 33/00* (2006.01)

(52) U.S. Cl.
CPC ............. *G01R 33/098* (2013.01); *G01R 1/18* (2013.01); *G01R 33/0023* (2013.01)

(58) Field of Classification Search
CPC .... G01R 1/18; G01R 15/205; G01R 31/1272; G01R 33/0023; G01R 33/098
See application file for complete search history.

(56) References Cited

U.S. PATENT DOCUMENTS

| 2013/0065086 A1* | 3/2013 | Kudo | ................... G11B 5/3903 |
| | | | 428/815 |
| 2018/0120357 A1* | 5/2018 | Takenaka | ............. G01R 15/185 |

* cited by examiner

*Primary Examiner* — Lee E Rodak
*Assistant Examiner* — Brent J Andrews
(74) *Attorney, Agent, or Firm* — Dragon Sun Law Firm, PC; Jinggao Li; Nathaniel Perkins

(57) ABSTRACT

A cable condition monitoring sensor device includes a TMR magnetic field sensor module, a high-pass filtering module, and a signal-amplifying module which are sequentially connected. The TMR magnetic field sensor module measures a magnetic field change signal of a cable, converts the same into a voltage signal, and outputs the voltage signal to the high-pass filtering module. The high-pass filtering module filters out DC bias of the voltage signal, and transmits the filtered voltage signal to the signal-amplifying module. The signal-amplifying module amplifies the filtered voltage signal to obtain an output voltage signal and outputs the output voltage signal. In the present invention, a common mode current to be measured in the cable is extracted by placing the magnetic shielding ring made of ferromagnetic material outside the cable to filter out a differential mode load current in the cable, and the magnitude of the common mode current is determined.

13 Claims, 3 Drawing Sheets

CABLE CONDITION MONITORING SENSOR DEVICE METHOD

CROSS-REFERENCE TO RELATED PATENT APPLICATION

This application claims priority to and the benefit of CN201910976500.1, filed Oct. 15, 2019 entitled "CABLE CONDITION MONITORING SENSOR DEVICE METHOD," by Pinjia Zhang et al. The entire disclosure of the above-identified application is incorporated herein by reference.

Some references, which may include patents, patent applications, and various publications, are cited and discussed in the description of the present disclosure. The citation and/or discussion of such references is provided merely to clarify the description of the present disclosure and is not an admission that any such reference is "prior art" to the present disclosure described herein. All references cited and discussed in this specification are incorporated herein by reference in their entireties and to the same extent as if each reference was individually incorporated by reference.

TECHNICAL FIELD

The present invention relates to the field of on-line cable insulation condition monitoring, and particularly, to a cable condition monitoring sensor device.

BACKGROUND OF THE INVENTION

Cables in operation often suffer from aging and failure due to moisture or overload, which affects the safe and reliable operation of power systems and causes huge economic loss. Therefore, there is an urgent need for a new online cable insulation monitoring method. In the power system and power equipment, the magnitude of a common mode current is usually used as an index for measuring an insulation leakage current and degree of aging. However, in the cable, the common mode current is weak, the interference by a relatively high differential mode load current exists, and the cable has a complex structure and a larger cable diameter, which makes it difficult to directly measure the common mode current. Therefore, the present patent proposes a common mode current sensor for on-line cable condition monitoring.

At present, Rogowski coils are used to measure common mode currents in cables and lead systems mostly. As shown in FIG. 1, a lead to be measured passes through a Rogowski coil structure formed by a plastic pipe and a coil winding the plastic pipe. When an alternating current flow in the lead to be measured, magnetic flux inside the coil changes, and then an alternating voltage is induced in the wound coil. This voltage is processed and output by a subsequent circuit and the magnitude of the current can be calculated therefrom.

As the most general current measurement scheme, the Rogowski coil has been widely used in the power system. However, for the measurement of common mode currents in an electrical equipment, especially in cables, the Rogowski coil has the following obvious defects.

1. As the Rogowski coil is not specifically designed for common mode current measurement, when there is a plurality of leads, especially when a geometric structure of each lead cannot be ignored, a magnetic field inside the Rogowski coil will be distorted; and when the interference by the relatively high differential mode load current in the lead exists, the magnetic field will be distorted more seriously, which causes great errors in measurement.

2. The Rogowski coil itself has relatively low measurement accuracy with the measurement error reaching several amperes. As a result, it is difficult to satisfy needs for measuring the micro common mode current (often in the order of mA) in the cable.

3. The measurement frequency band of the Rogowski coil is limited. For low-frequency band current signals, the induced voltage is relatively lower and the measurement accuracy is reduced.

Therefore, a heretofore unaddressed need exists in the art to address the aforementioned deficiencies and inadequacies.

SUMMARY OF THE INVENTION

The present invention aims to solve the problem of common mode current measurement in on-line cable monitoring. By taking a 6/10 kV three-phase medium voltage cable having a length of 2500 m as an example, in the process of on-line monitoring, it is assumed that an injection voltage of 1 kV is applied to the three phases, the common mode current in a main loop is about 0.5 A in a good insulation state, and this current value is increased by 10% in the case of insulation aging. Therefore, the present invention aims to measure the change of a common mode current of about 0.05 A, wherein the measurement range is 0-1 A. At the same time, it needs to overcome the interference by a load current which is about 10 A or tens of amperes and varies with the load change.

In order to solve the above problem, the present invention provides a cable condition monitoring sensor device, which includes a TMR magnetic field sensor module 1, a high-pass filtering module 2, and a signal-amplifying module 3 which are sequentially connected.

The TMR magnetic field sensor module 1 measures a magnetic field change signal of a cable, converts the same into a voltage signal, and outputs the voltage signal to the high-pass filtering module 2.

The high-pass filtering module 2 filters out DC bias of the voltage signal, and transmits the filtered voltage signal to the signal-amplifying module 3.

The signal-amplifying module 3 amplifies the filtered voltage signal to obtain an output voltage signal and outputs the output voltage signal.

Further, the cable condition monitoring sensor device further includes a calculating module for calculating a common mode current value in the cable according to the output voltage signal.

Further, the TMR magnetic field sensor module 1 includes:

a magnetic shielding ring 5 and a TMR magnetic field sensor 6, wherein the TMR magnetic field sensor 6 is disposed close to or adjacent to the periphery of the magnetic shielding ring 5; and when a cable to be measured 4 passes through the magnetic shielding ring 5, the TMR magnetic field sensor located outside the magnetic shielding ring 5 measures a magnetic field change signal of the cable to be measured 4.

Further, the magnetic shielding ring 5 is a permalloy magnetic shielding ring.

Further, the design of the TMR magnetic field sensor module satisfies multi-objective optimization conditions in the following formula:

$$\begin{cases} \max_{r_{in}, r_{out}, \varphi} & SNR \\ \max_{r_{in}, r_{out}, \varphi} & B_{detect} \\ \min_{r_{in}, r_{out}, \varphi} & r_{out} - r_{in} \end{cases} \quad (1)$$

where SNR is the signal-to-noise ratio and expressed as $$SNR = 20 \lg\left(\frac{B_{detect-z}}{B_{detect-p}}\right),$$

$B_{detect-z}$ is magnetic field strength generated by a common mode current, and $B_{detect-p}$ is magnetic field strength generated by a differential mode load current;

$B_{detect}$ is magnetic field strength measured and calculated by the TMR magnetic field sensor;

$r_{out}$-$r_{in}$ denotes the thickness of the magnetic shielding ring (5), $r_{out}$ denotes the outer ring radius, $r_{in}$ denotes the inner ring radius, cp denotes the position angle of the TMR magnetic field sensor, and a polar coordinate system is used with the horizontal direction of 0° and an anticlockwise direction as a positive direction; and the formula (1) is optimized on the basis of adjustment on $r_{out}$, $r_{in}$ and φ.

Further, $B_{detect}$ is calculated according to the following formula:

$$B_{detect} = \frac{\mu_0 \sum_{i=1}^{3} I_i}{2\pi r} + \frac{1}{r} \sum_{i=1}^{3} \sum_{n=1}^{\infty} \frac{\frac{\mu_0 I_i}{n\pi}\left(\frac{b_i}{r}\right)^n \cos(n\varphi - \theta_i)}{\frac{(\mu_0 + \mu_1)^2}{2\mu_0 \mu_1} - \left(\frac{r_{in}}{r_{out}}\right)^{2n} \frac{(\mu_0 - \mu_1)^2}{2\mu_0 \mu_1}}, \quad (2)$$

where r and φ denote polar coordinates of the TMR magnetic field sensor respectively; $r_{in}$ and $r_{out}$ denote the inner ring radius and the outer ring radius of the magnetic shielding ring respectively; $İ_i$ denotes a current of each wire, and $b_i$ and $θ_i$ constitute polar coordinates of a lead position; and $B_{detect-z}$ and $B_{detect-p}$ are calculated according to the formula (2), where $İ_i$ is changed to a zero-sequence component value and a positive-sequence component value of the currents of the lead respectively.

Further, the problem of multi-objective optimization of the formula (1) is solved with a heuristic algorithm PESA-II so as to determine values of $r_{out}$, $r_{in}$ and φ.

Further, according to the heuristic algorithm, $r_{out}$ is 36 mm, and $r_{in}$ is 45 mm. In addition, the optimization algorithm shows that measurement requirements can also be satisfied when $r_{out}$ is in the range of 36-38 mm and $r_{in}$ is in the range of 45-46 mm, and it only needs to select an optimal set of parameters in the design. Moreover, according to the heuristic algorithm, φ is −90°, that is, the TMR magnetic field sensor 6 is located directly under the magnetic shielding ring 5.

Further, in the step that the signal-amplifying module 3 amplifies the filtered voltage signal to obtain the output voltage signal and outputs the output voltage signal, the obtained voltage signal is amplified in two stages through a differential amplifying circuit chip.

In summary, the cable condition monitoring sensor device according to the present invention includes the TMR magnetic field sensor module, the high-pass filtering module, and the signal-amplifying module which are sequentially connected to each other. The TMR magnetic field sensor module measures the magnetic field change signal of the cable, converts the same into the voltage signal, and outputs the voltage signal to the high-pass filtering module. The high-pass filtering module filters out DC bias of the voltage signal, and transmits the filtered voltage signal to the signal-amplifying module. The signal-amplifying module amplifies the filtered voltage signal to obtain the output voltage signal and outputs the output voltage signal. In the present invention, the common mode current to be measured in the cable is extracted by placing the magnetic shielding ring made of ferromagnetic material outside the cable to filter out the differential mode load current in the cable, and the magnitude of the common mode current is determined. The analysis on the magnetic field shows that by using the magnetic shielding ring made of high magnetic permeability material, the magnetic field generated by the differential mode current in the cable may be filtered out and at the same time, the magnetic field generated by the common mode current to be measured is not affected.

The present invention has the following remarkable advantages.

1. In the present invention, the magnetic field outside the permalloy magnetic shielding ring is measured with the tunneling magnetoresistance (TMR) sensor. Since the TMR magnetic field sensor has extremely high sensitivity and a relatively wider frequency band, this device can measure the micro common mode current.

2. The present invention proposes a complete solution formula for the magnetic field in the measuring space. This solution formula has a relatively high accuracy, and the resulting solution has a more concise form by eliminating influences of eddy currents, and thus may be used for subsequent optimization design.

3. The permalloy magnetic shielding ring used in the present invention is designed in an optimized manner and is an optimal device in some sense for measuring the common mode current and filtering out the differential mode current in the cable. By converting a device design problem into a multi-objective optimization problem, an optimal design scheme of the device is obtained with the multi-objective optimization algorithm PESA-II.

4. It has been verified in a laboratory that the designed common mode current measurement device of the cable has measurement accuracy of 4.19% for the common mode currents of 0-1 A and has the measurement accuracy of 8.61% for the common mode currents of 0-0.14 A. The measurement for these currents is achieved in the case that the differential mode load current greater than 10 A exists. It proves that the device can accurately measure the micro common mode current in the cable.

BRIEF DESCRIPTION OF THE DRAWINGS

The accompanying drawings illustrate one or more embodiments of the present invention and, together with the written description, serve to explain the principles of the invention. Wherever possible, the same reference numbers are used throughout the drawings to refer to the same or like elements of an embodiment.

DETAILED DESCRIPTION OF THE INVENTION

In order to make the objects, technical solutions, and advantages of the present invention clearer, the present invention is described in further detail below with reference to the accompanying drawings. It should be understood that the description is merely exemplary and is not intended to limit the scope of the present invention. Moreover, in the following description, well-known structures and techniques are not described to avoid unnecessarily obscuring the concept of the present invention.

Figure 1:
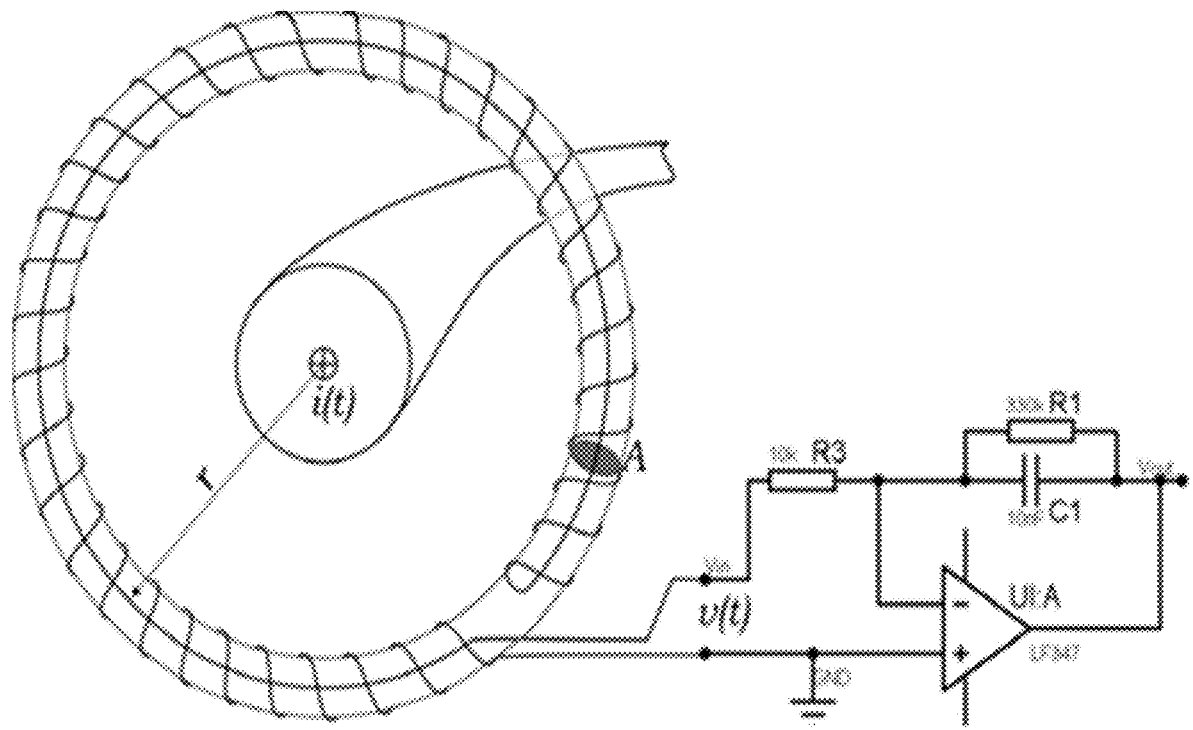
FIG. 1 is a structural diagram of a Rogowski coil in the prior art.
Figure 2:
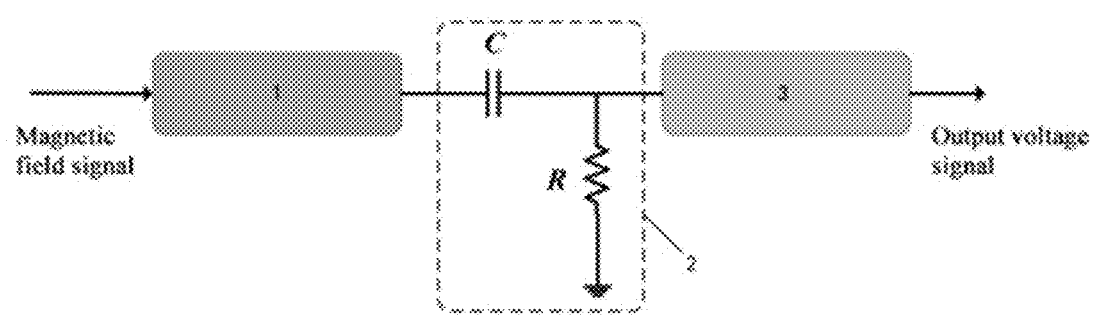
FIG. 2 is a structural diagram of a cable condition monitoring sensor device according to an embodiment of the present invention.

The present invention provides a cable condition monitoring sensor device. As shown in FIG. 2, the cable condition monitoring sensor device includes a TMR magnetic field sensor module 1, a high-pass filtering module 2, and a signal-amplifying module 3 which are sequentially connected. The TMR magnetic field sensor module 1 measures a magnetic field change signal of a cable, converts the same into a voltage signal, and outputs the voltage signal to the high-pass filtering module 2. The high-pass filtering module 2 filters out DC bias of the voltage signal, and transmits the filtered voltage signal to the signal-amplifying module 3. The signal-amplifying module 3 amplifies the filtered voltage signal to obtain an output voltage signal and outputs the output voltage signal. Further, the cable condition monitoring sensor device further includes a calculating module for calculating a common mode current value in the cable according to the output voltage signal.

Specifically, a multi-dimensional TMR chip 2901 may be used as the TMR magnetic field sensor and this chip may linearly convert the magnetic field signal into the voltage signal and then outputs the voltage signal. The DC bias caused by internal asymmetry of the TMR chip is filtered out when the output signal passes through the high-pass filtering module composed of RCs. Finally, the obtained voltage signal is amplified in two stages through a differential amplifying chip (such as chip AD623 or AD8012) and then the output signal is observed through an oscilloscope externally connected with an SMA interface or is subjected to data collection and processing through a microprocessor.

Figure 3:
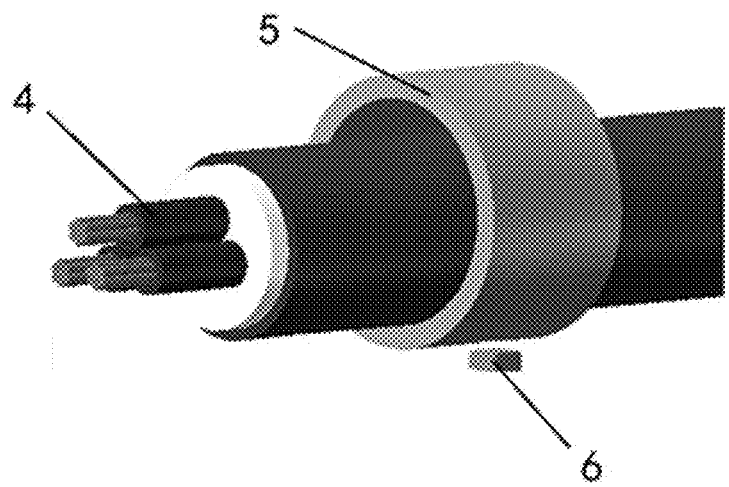
FIG. 3 is a structural diagram of a TMR magnetic field sensor module.

Further, the TMR magnetic field sensor module 1 includes, as shown in FIG. 3, a magnetic shielding ring 5 and a TMR magnetic field sensor 6. The TMR magnetic field sensor 6 is disposed close to or adjacent to the periphery of the magnetic shielding ring 5; and when a cable to be measured 4 passes through the magnetic shielding ring 5, the TMR magnetic field sensor located outside the magnetic shielding ring 5 measures a magnetic field change signal of the cable to be measured 4. The magnetic shielding ring 5 may be a magnetic shielding ring made of permalloy material having relatively high magnetic permeability. The following provides the description by taking the magnetic shielding ring made of permalloy as an example, but the material of the magnetic shielding ring is not limited to permalloy and may be other materials. Specifically, the permalloy magnetic shielding ring is configured to shield a magnetic field generated by a relatively high differential mode load current in the cable, so that a magnetic field generated by a common mode current in the cable is extracted, and measured by the TMR magnetic field sensor. The TMR magnetic field sensor is placed close to or adjacent to the exterior of the permalloy magnetic shielding ring, measures a weak magnetic field change signal through a bridge structure formed by four tunneling magnetoresistance elements inside, converts the weak magnetic field change signal into a voltage signal and then outputs the voltage signal. Thus, the magnitude of the common mode current in the cable may be obtained according to the output voltage signal. In the present invention, the magnetic field outside the permalloy magnetic shielding ring is measured with the tunneling magnetoresistance (TMR) sensor. Since the TMR magnetic field sensor has extremely high sensitivity and a relatively wider frequency band, this device can measure the micro common mode current.

Figure 4:
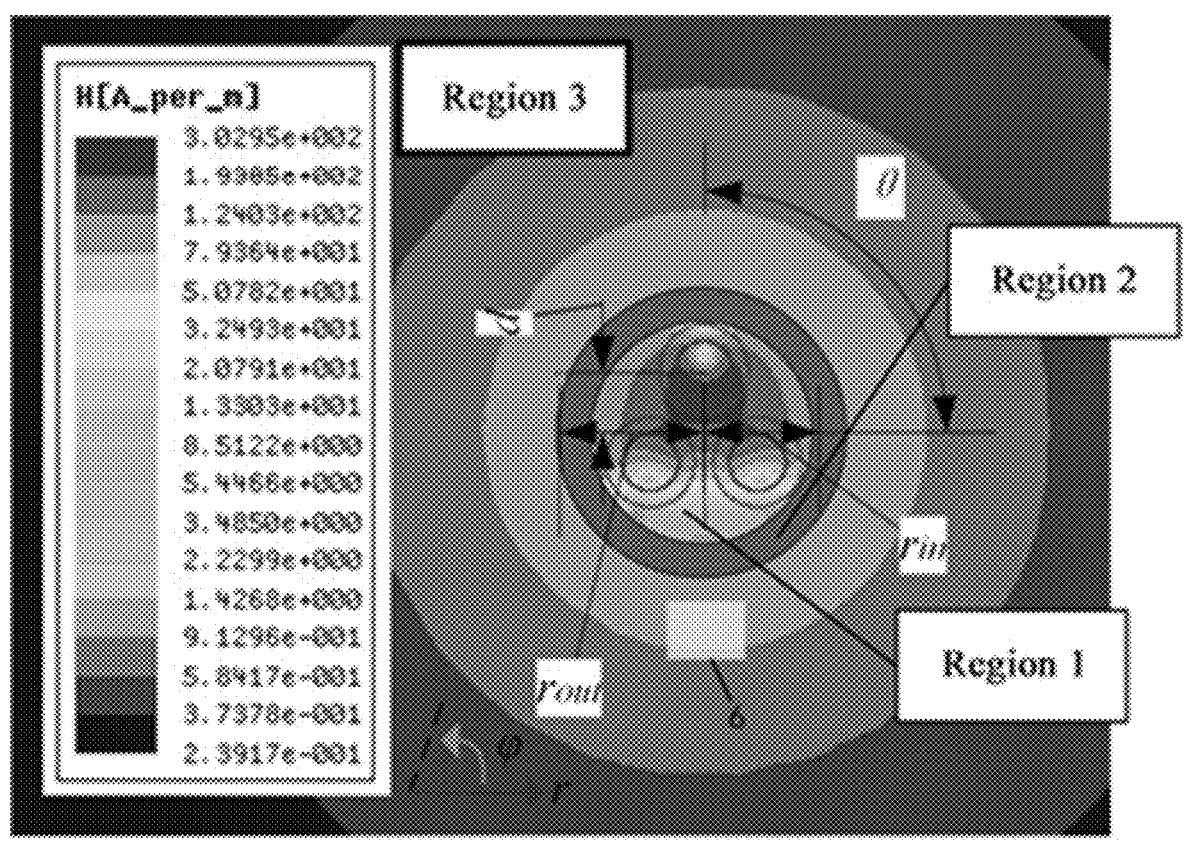
FIG. 4 is a diagram showing a measurement plane and region according to an embodiment of the present invention.

Since the magnetic field sensor is disposed on the outer surface of the permalloy magnetic shielding ring during measurement, the analysis on the magnetic field in this problem can be simplified as analysis on the magnetic field in the 2D case. Firstly, for line current sources $\vec{j}_1$, $\vec{j}_2$, and $\vec{j}_3$ enclosed inside the permalloy magnetic shielding ring, magnetic vector potentials in three different regions may be expressed as follows, where $\vec{A}_1$, $\vec{A}_2$ and $\vec{A}_3$ dote magnetic vector potentials in region 1, region 2 and region 3 respectively. Region partition is as shown in FIG. 4, where region 1 is a region inside the magnetic shielding ring (air), region 2 is a region on the magnetic shielding ring (permalloy) and region 3 is a region outside the magnetic shielding ring (air).

$$\nabla^2 \vec{A}_1 = -\mu_0(\vec{j}_1 + \vec{j}_2 + \vec{j}_3)$$

$$\nabla^2 \vec{A}_2 = 0$$

$$\nabla_2 \vec{A}_2 = 0 \qquad (1)$$

It can be seen from symmetry that directions of magnetic vector potentials in various regions are perpendicular to an observed 2D plane (which may be regarded as z direction), and thus research on a z-axis component of the magnetic vector potential A is only carried out assuming that a single lead with the coordinates of (b, 0) is considered only. In the case of a plurality of leads, all that is needed is to superpose the magnetic vector potentials and magnetic induction intensity. According to principles of the magnetic vector potential equation and mathematical physical equation, solutions of magnetic vector potentials in the various different regions have the following forms, where b denotes a distance of an observed lead to an origin, (r, φ) denotes polar coordinates of the observed point, and $e_n$, $f_n$, $f_0$, $g_n$, $h_n$, $h_0$, $j_n$ and $j_0$ denote parameters to be solved.

$$A_{1z} = -\frac{\mu_0}{4\pi} I \ln(r^2 + b^2 - 2rb\cos\varphi) + \sum_{n=1}^{\infty}(e_n r^n + f_n r^{-n})\cos n\varphi + f_0 \ln r \qquad (2)$$

$$A_{2z} = \sum_{n=1}^{\infty}(g_n r^n + h_n r^{-n})\cos n\varphi + h_0 \ln r$$

$$A_{3z} = \sum_{n=1}^{\infty} j_n r^{-n} \cos n\varphi + j_0 \ln r.$$

According to electrodynamics principles, relationships between magnetic induction intensity and boundary conditions in various regions may be expressed as follows:

$$R_{ri} = R_{rj}$$

$$B_{\varphi i}/\mu_i = B_{\varphi j}/\mu_j$$

$$\vec{B}_i = \nabla \times \vec{A}_i, i,j=1,2,3, i \neq j \qquad (3).$$

In the above formula, $\vec{B}_i$ denotes magnetic induction intensity in each region, with radial and tangential components being expressed as $B_{ri}$ and $B_{\varphi i}$ respectively, and $\mu_i$ denotes the magnetic permeability in each region. The magnetic permeability is $\mu_0$ in regions 1 and 3 and is, in region 2, the magnetic permeability $\mu_1$ of the used permalloy. Unknown parameters in the expression of the magnetic vector potential A are solved according to the boundary conditions as follows:

$$j_0 = -\frac{\mu_0}{2\pi}I, \quad j_n = \frac{\frac{\mu_0}{n\pi}Ib^n}{\frac{(\mu_0+\mu_1)^2}{2\mu_0\mu_1} - \left(\frac{r_{in}}{r_{out}}\right)^{2n}\frac{(\mu_0-\mu_1)^2}{2\mu_0\mu_1}} \tag{4}$$

$$g_n = \frac{\mu_0-\mu_1}{2\mu_0}\frac{1}{r_{out}^{2n}}j_n, \quad h_0 = -\frac{\mu_1}{2\pi}I, \quad h_n = \frac{\mu_0+\mu_1}{2\mu_0}j_n$$

$$e_n = \frac{\mu_0+\mu_1}{2\mu_0}\frac{1}{r_{in}^{2n}}j_n + \frac{\mu_0-\mu_1}{2\mu_0}\frac{1}{r_{out}^{2n}}j_n - \frac{\mu_0 I}{2\pi n}\frac{b^n}{r_{in}^{2n}}.$$

The magnetic vector potential A may be expressed as follows:

$$A_{1z} = -\frac{\mu_0 I}{4\pi}\ln(r^2 + b^2 - 2rb\cos\varphi) + \tag{5}$$

$$\sum_{n=1}^{\infty}\left(\frac{\left(\frac{\mu_0+\mu_1}{2\pi n}\frac{b^n}{r_{in}^{2n}} + \frac{\mu_0-\mu_1}{2\pi n}\frac{b^n}{r_{out}^{2n}}\right)I}{\frac{(\mu_0+\mu_1)^2}{2\mu_0\mu_1} - \left(\frac{r_{in}}{r_{out}}\right)^{2n}\frac{(\mu_0-\mu_1)^2}{2\mu_0\mu_1}} - \frac{\mu_0 I}{2\pi n}\frac{b^n}{r_{in}^{2n}}\right)r^n\cos n\varphi$$

$$A_{2z} = -\frac{\mu_1 I}{2\pi}\ln r + \sum_{n=1}^{\infty}\left(\frac{\left(\frac{\mu_0+\mu_1}{2\pi n}\frac{b^n}{r^n} + \frac{\mu_0-\mu_1}{2\pi n}\frac{b^n r^n}{r_{out}^{2n}}\right)I}{\frac{(\mu_0+\mu_1)^2}{2\mu_0\mu_1} - \left(\frac{r_{in}}{r_{out}}\right)^{2n}\frac{(\mu_0-\mu_1)^2}{2\mu_0\mu_1}}\right)\cos n\varphi$$

$$A_{3z} = -\frac{\mu_0 I}{2\pi}\ln r + \sum_{n=1}^{\infty}\frac{\frac{\mu_0 I}{n\pi}\left(\frac{b}{r}\right)^n\cos n\varphi}{\frac{(\mu_0+\mu_1)^2}{2\mu_0\mu_1} - \left(\frac{r_{in}}{r_{out}}\right)^{2n}\frac{(\mu_0-\mu_1)^2}{2\mu_0\mu_1}}.$$

By substituting the magnetic vector potential A in the expression of magnetic induction intensity, the magnetic field strength induced by the single lead outside the permalloy magnetic shielding ring may be solved as follows:

$$B_{r3} = -\frac{1}{r}\sum_{n=1}^{\infty}\frac{\frac{\mu_0 I}{\pi}\left(\frac{b}{r}\right)^n}{\frac{(\mu_0+\mu_1)^2}{2\mu_0\mu_1} - \left(\frac{r_{in}}{r_{out}}\right)^{2n}\frac{(\mu_0-\mu_1)^2}{2\mu_0\mu_1}}\sin n\varphi \tag{6}$$

$$B_{\varphi 3} = \frac{\mu_0 I}{2\pi r} + \frac{1}{r}\sum_{n=1}^{\infty}\frac{\frac{\mu_0 I}{\pi}\left(\frac{b}{r}\right)^n}{\frac{(\mu_0+\mu_1)^2}{2\mu_0\mu_1} - \left(\frac{r_{in}}{r_{out}}\right)^{2n}\frac{(\mu_0-\mu_1)^2}{2\mu_0\mu_1}}\cos n\varphi.$$

The tangential magnetic field strength $B_{detect}$ generated by the plurality of leads is as follows and is obtained by the superposition of the tangential magnetic field strength of various single leads assuming that the i-th lead is located at coordinates ($b_i$, $\theta_i$).

$$\dot{B}_{detect} = \frac{\mu_0\sum_{i=1}^{3}\dot{I}_i}{2\pi r} + \frac{1}{r}\sum_{i=1}^{3}\sum_{n=1}^{\infty}\frac{\frac{\mu_0 \dot{I}_i}{n\pi}\left(\frac{b_i}{r}\right)^n\cos(n\varphi-\theta_i)}{\frac{(\mu_0+\mu_1)^2}{2\mu_0\mu_1} - \left(\frac{r_{in}}{r_{out}}\right)^{2n}\frac{(\mu_0-\mu_1)^2}{2\mu_0\mu_1}} \tag{7}$$

In the above formula, r and ω denote polar coordinates of the magnetic field sensor; the coordinate system and meanings of specific parameters are as shown in FIG. 4; the origin of the polar coordinate system is located at the center of a circle of the magnetic shielding ring, the horizontal angle is 0°, and the counterclockwise direction is used as the positive direction; $r_{in}$ and $r_{out}$ denote the inner ring radius and the outer ring radius of the used permalloy magnetic shielding ring respectively; and $\dot{I}_i$, $b_i$ and $\theta_i$ denote a current and position coordinates of each lead respectively, and denote the magnitude of the current, a distance of the lead to the origin and a deflection angle in the counterclockwise direction respectively. When the used permalloy magnetic shielding ring has relatively high magnetic permeability, the second item in the above formula may be approximately zero and the magnetic field strength $B_{detect}$ may be calculated according to the following formula:

$$\dot{B}_{detect} \approx \frac{\mu_0}{2\pi r}\sum_{i=1}^{3}\dot{I}_i. \tag{8}$$

Therefore, the magnetic induction intensity measured by the magnetic field sensor is mainly composed of common mode currents, and the magnetic field fluctuation caused by the lead position and the differential mode load current will be offset. The present invention proposes a complete solution formula for the magnetic field in the measuring space. The solution formula has relatively high accuracy, and the resulting solution has a more concise form by eliminating influences of eddy currents, which may be used for subsequent optimization design.

Based on analysis on the magnetic field strength around the cable and the magnetic filter ring, the above TMR magnetic field sensor module may be designed with an optimization algorithm. Objective functions to be optimized are as follows:

$$\begin{cases}\max_{r_{in},r_{out},\varphi} & SNR \\ \max_{r_{in},r_{out},\varphi} & B_{detect} \\ \min_{r_{in},r_{out},\varphi} & r_{out} - r_{in}\end{cases} \tag{9}$$

where SNR is the signal-to-noise ratio and expressed as $$SNR = 20\lg\left(\frac{B_{detect-z}}{B_{detect-p}}\right);$$

$B_{detect-z}$ is magnetic field strength generated by the common mode current; and $B_{detect-p}$ is magnetic field strength generated by the differential mode load current. Both $B_{detect-z}$ and $B_{detect-p}$ are calculated according to the following formulas: where $I_{i-z}$ and $I_{i-p}$ denote a zero-sequence component value and a positive-sequence component value of the currents respectively.

$$\dot{B}_{detect-z} = \frac{\mu_0}{2\pi r}\sum_{i=1}^{3}I_{i-z} + \frac{1}{r}\sum_{i=1}^{3}\sum_{n=1}^{\infty}\frac{\frac{\mu_0 I_{i-z}}{\pi}\left(\frac{b_i}{r}\right)^n}{\frac{(\mu_0+\mu_1)^2}{2\mu_0\mu_1} - \left(\frac{r_{in}}{r_{out}}\right)^{2n}\frac{(\mu_0-\mu_1)^2}{2\mu_0\mu_1}}\cos(n\varphi - \theta_i) \quad (10)$$

$$\dot{B}_{detect-p} = \frac{\mu_0}{2\pi r}\sum_{i=1}^{3}I_{i-p} + \frac{1}{r}\sum_{i=1}^{3}\sum_{n=1}^{\infty}\frac{\frac{\mu_0 I_{i-p}}{\pi}\left(\frac{b_i}{r}\right)^n}{\frac{(\mu_0+\mu_1)^2}{2\mu_0\mu_1} - \left(\frac{r_{in}}{r_{out}}\right)^{2n}\frac{(\mu_0-\mu_1)^2}{2\mu_0\mu_1}}\cos(n\varphi - \theta_i) \quad (11)$$

$B_{detect}$ is the magnetic field strength measured and calculated by the TMR magnetic field sensor. It is desired that values of the SNR and $B_{detect}$ are as larger as possible so as to ensure a good measurement effect, whereas $r_{out}$-$r_{in}$ denotes the thickness of the used permalloy magnetic shielding ring and thus it is desired that this thickness is as small as possible to reduce the processing cost. The formula (9) is optimized on the basis of adjustment on $r_{out}$, $r_{in}$ and $\varphi$.

Figure 5:
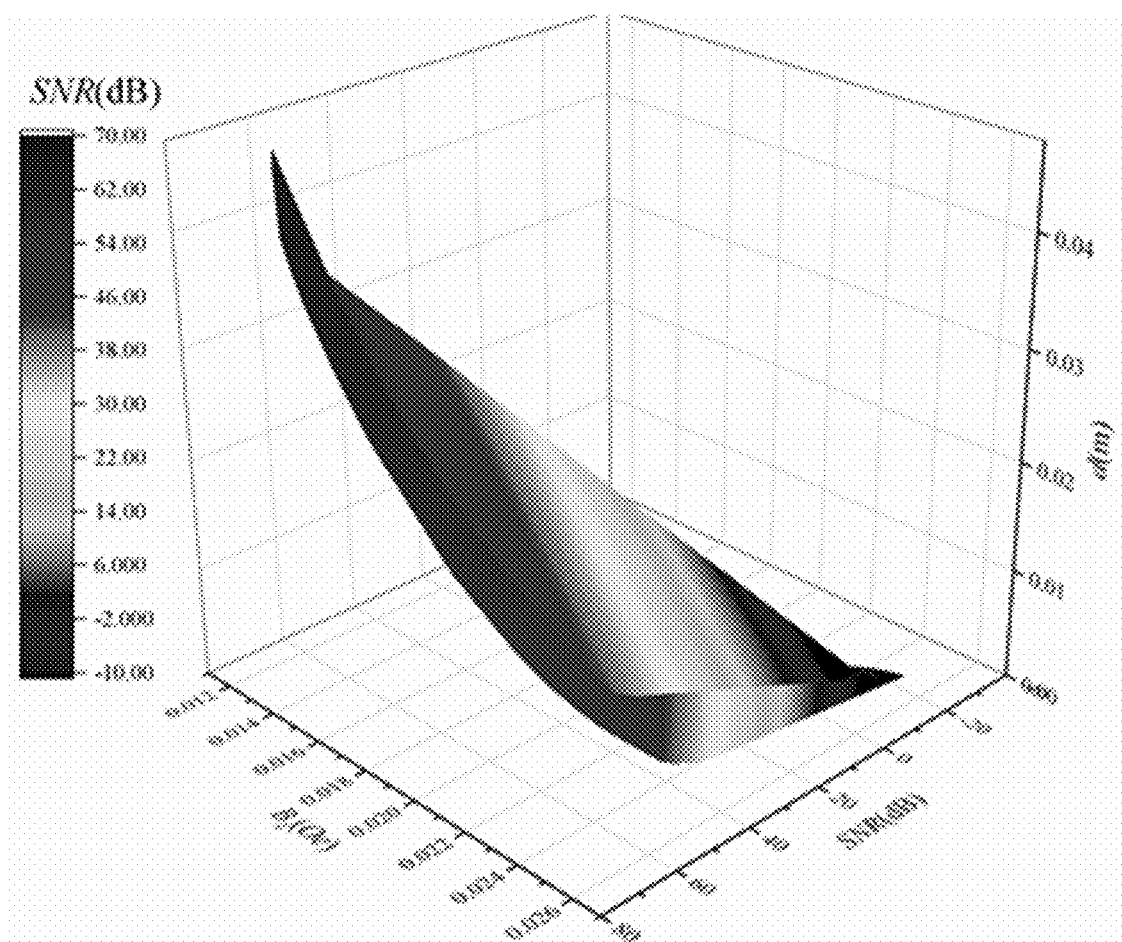
FIG. 5 is a diagram showing a multi-objective optimization result Pareto plane according to an embodiment of the present invention.

In order to solve the proposed problem of multi-objective optimization to determine values of $r_{out}$, $r_{in}$ and $\varphi$, a heuristic algorithm PESA-II is used. In this algorithm, the concept of crowding degree is introduced on the basis of a traditional heuristic algorithm, so that the system population tends to be distributed in a region with fewer population individuals during the evolution process. An obtained multi-objective optimization result Pareto front is as shown in FIG. 5. According to this figure and design requirements, the permalloy magnetic shielding ring having an inner ring diameter of 36 mm and an outer ring diameter of 45 mm is obtained finally and $\varphi$ is −90°, that is, a measurement device composed of the TMR magnetic field sensor is located directly under the magnetic shielding ring. The permalloy magnetic shielding ring used in the present invention is designed in an optimized manner and is an optimal device in some sense for measuring the common mode current and filtering the differential mode current in the cable. By converting a device design problem into a multi-objective optimization problem, an optimal design scheme of the device is obtained with the multi-objective optimization algorithm PESA-II.

A common mode current measurement experiment is performed with the designed measurement device. The cable used in the experiment is a 6/10 kV XLPE three-phase cable having a cable conductor sectional area of 50 mm² and an external radius of 30 mm Table 1 and Table 2 show experiment measurement results of the designed measurement device under different common mode currents and differential mode currents.

TABLE 1

Measurement results for common mode currents of 0–1.2 A

| Differential mode current $I_{DM}$ = 2.73 A | | Differential mode current $I_{DM}$ = 5.85 A | | Differential mode current $I_{DM}$ = 12.46 A | |
|---|---|---|---|---|---|
| True value of common mode current $I_{CM}$ (A) | Measured value (A) | True value of common mode current $I_{CM}$ (A) | Measured value (A) | True value of common mode current $I_{CM}$ (A) | Measured value (A) |
| 0.12 | 0.12 | 0.14 | 0.14 | 0.13 | 0.13 |
| 0.27 | 0.27 | 0.27 | 0.27 | 0.24 | 0.25 |
| 0.39 | 0.40 | 0.41 | 0.40 | 0.39 | 0.40 |
| 0.53 | 0.53 | 0.53 | 0.52 | 0.54 | 0.55 |
| 0.67 | 0.67 | 0.70 | 0.67 | 0.65 | 0.66 |
| 0.79 | 0.79 | 0.83 | 0.80 | 0.78 | 0.79 |
| 0.92 | 0.92 | 0.96 | 0.92 | 0.89 | 0.90 |
| 1.02 | 1.02 | 1.04 | 1.00 | 1.00 | 1.01 |
| 1.13 | 1.14 | 1.17 | 1.14 | 1.10 | 1.12 |
| 1.21 | 1.21 | 1.26 | 1.22 | 1.19 | 1.21 |
| Maximum relative error | | | | | |
| 2.66% | | 4.19% | | 4.19% | |

TABLE 2

Measurement results for common mode currents of 0–0.14 A

| Differential mode current $I_{DM}$ = 2.68 A | | Differential mode current $I_{DM}$ = 5.98 A | | Differential mode current $I_{DM}$ = 10.75 A | |
|---|---|---|---|---|---|
| True valve of common mode current $I_{CM}$ (A) | Measured value (A) | True valve of common mode current $I_{CM}$ (A) | Measured value (A) | True valve of common mode current $I_{CM}$ (A) | Measured value (A) |
| 0.012 | 0.012 | 0.013 | 0.013 | 0.015 | 0.015 |
| 0.029 | 0.030 | 0.027 | 0.029 | 0.029 | 0.027 |
| 0.041 | 0.042 | 0.039 | 0.040 | 0.045 | 0.042 |
| 0.055 | 0.056 | 0.055 | 0.057 | 0.061 | 0.056 |
| 0.072 | 0.074 | 0.069 | 0.072 | 0.078 | 0.073 |
| 0.082 | 0.084 | 0.084 | 0.088 | 0.092 | 0.088 |
| 0.099 | 0.102 | 0.099 | 0.105 | 0.108 | 0.100 |
| 0.110 | 0.116 | 0.111 | 0.112 | 0.122 | 0.113 |
| 0.123 | 0.128 | 0.119 | 0.130 | 0.131 | 0.121 |
| 0.137 | 0.144 | 0.133 | 0.143 | 0.137 | 0.130 |
| Maximum relative error | | | | | |
| 5.75% | | 8.51% | | 8.61% | |

The experimental results prove that the designed experimental device can solve the problem of common mode current measurement in the three-phase cable. Under the interference of the differential mode load current greater than 10 A, the measurement error is less than 4.19% for the common mode currents of 0–1.2 A, and is within 8.61% for smaller common mode currents, such as common mode currents of 0–0.14 A, which shows the good measurement effect and relatively high common mode current measurement accuracy of this device.

Compared with a traditional common mode current measurement method, the present invention can measure tiny common mode currents in on-line cable insulation monitoring without being affected by relatively high differential mode load currents in the cable. The experiment proves that the device can extract the total three-phase common mode current of 5 mA from the three-phase differential mode load current of 7 A, realizes measurement in the case that the signal-to-noise ratio is 2.4×10^(−4), and has the measurement accuracy of 4.19% for the relatively smaller common mode currents of 0–1 A, and 8.61% for the relatively smaller common mode currents of 0–0.1 A. These two types of measurement are achieved under the interference of the three-phase differential mode load current greater than 10 A.

In summary, the present invention realizes high-accuracy measurement of the micro common mode current under the interference of the relatively high differential mode load current. The measurement is not affected by the position, shape and structure of the conductor, and has a great engineering application value in the field of on-line cable monitoring.

In summary, the cable condition monitoring sensor device according to the present invention includes the TMR magnetic field sensor module, the high-pass filtering module, and the signal-amplifying module which are sequentially connected. The TMR magnetic field sensor module measures the magnetic field change signal of the cable, converts the same into the voltage signal, and outputs the voltage signal to the high-pass filtering module. The high-pass filtering module filters out DC bias of the voltage signal, and transmits the filtered voltage signal to the signal-amplifying module. The signal-amplifying module amplifies the filtered voltage signal to obtain the output voltage signal and outputs the output voltage signal. In the present invention, the common mode current to be measured in the cable is extracted by placing the magnetic shielding ring made of ferromagnetic material outside the cable to filter out the differential mode load current in the cable. The analysis on the magnetic field shows that by using the magnetic shielding ring made of high magnetic permeability material, the magnetic field generated by the differential mode current in the cable may be filtered out and at the same time, the magnetic field generated by the common mode current to be measured is not affected.

It should be understood that the above specific embodiments of the present invention are merely used to illustrate or explain the principle of the present invention and not intended to limit the present invention. Therefore, any modifications, equivalent replacements, improvements and the like made without departing from the spirit and scope of the present invention should be included within the scope of protection of the present invention. In addition, the appended claims of the present invention are intended to cover all changes and modifications that fall within the scope and boundary of the appended claims or equivalents thereof.

The foregoing description of the exemplary embodiments of the present invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A cable condition monitoring sensor device, comprising a TMR magnetic field sensor module, a high-pass filtering module, and a signal amplifying module which are sequentially connected, wherein the TMR magnetic field sensor module measures a magnetic field change signal of a cable, converts the same into a voltage signal, and outputs the voltage signal to the high-pass filtering module; wherein the TMR magnetic field sensor module comprises: a magnetic shielding ring and a TMR magnetic field sensor, wherein the TMR magnetic field sensor is disposed close to or adjacent to the periphery of the magnetic shielding ring; and when a cable to be measured passes through the magnetic shielding ring, the TMR magnetic field sensor located outside the magnetic shielding ring measures a magnetic field change signal of the cable to be measured;

wherein the design of the TMR magnetic field sensor module satisfies multi-objective optimization conditions in the following formula:

$$\begin{cases} \max_{r_{in},r_{out},\varphi} & SNR \\ \max_{r_{in},r_{out},\varphi} & B_{detect} \\ \min_{r_{in},r_{out},\varphi} & r_{out} - r_{in} \end{cases} \quad (1)$$

where SNR is the signal-to-noise ratio and expressed as $$SNR = 20 \lg\left(\frac{B_{detect-z}}{B_{detect-p}}\right)$$

$B_{detect-z}$ is magnetic field strength generated by a common mode current, and $B_{detect-p}$ is magnetic field strength generated by a differential mode load current; $B_{detect}$ is magnetic field strength measured and calculated by the TMR magnetic field sensor $r_{out}$-$r_{in}$ denotes the thickness of the magnetic shielding wing, $r_{out}$ denotes the outer ring radius, $r_{in}$ denotes the inner ring radius, $\varphi$ denotes the position angle of the TMR magnetic field sensor, and a polar coordinate system is used with the horizontal direction of 0° and an anticlockwise direction as a positive direction; and the formula (1) is optimized on the basis of adjustment on $r_{out}$, $r_{in}$ and $\varphi$;

the high-pass filtering module filters out DC bias of the voltage signal, and transmits the filtered voltage signal to the signal-amplifying module; and the signal-amplifying module amplifies the filtered voltage signal to obtain an output voltage signal and outputs the output voltage signal.

2. The cable condition monitoring sensor device according to claim 1, further comprising a calculating module for calculating a common mode current value in the cable according to the output voltage signal.

3. The cable condition monitoring sensor device according to claim 1, wherein the magnetic shielding ring is a permalloy magnetic shielding ring.

4. The cable condition monitoring sensor device according to claim 1 wherein $B_{detect}$ is calculated according to the following formula:

$$B_{detect} = \frac{\mu_0 \sum_{i=1}^{3} I_i}{2\pi r} + \frac{1}{r}\sum_{i=1}^{3}\sum_{n=1}^{\infty} \frac{\frac{\mu_0 I_i}{n\pi}\left(\frac{b_i}{r}\right)^n \cos(n\varphi - \theta_i)}{\frac{(\mu_0 + \mu_1)^2}{2\mu_0\mu_1} - \left(\frac{r_{in}}{r_{out}}\right)^{2n}\frac{(\mu_0 - \mu_1)^2}{2\mu_0\mu_1}}, \quad (2)$$

where $r$ and $\varphi$ denote polar coordinates of the TMR magnetic field sensor respectively; $r_{in}$ and $r_{out}$ denote the inner ring radius and the outer ring radius of the magnetic shielding ring respectively; $I_i$ denotes a current of each wire, and $b_i$ and $\theta_i$ constitute polar coordinates of a lead position; and $B_{detect-z}$ and $B_{detect-p}$ are also calculated according to the formula (2), where $I_i$ is changed to a zero-sequence component value and a positive-sequence component value of the currents of the lead respectively.

5. The cable condition monitoring sensor device according to claim 1, wherein the problem of multi-objective optimization of formula (1) is solved with a heuristic algorithm PESA-II so as to determine values of $r_{out}$, $r_{in}$ and $\varphi$.

6. The cable condition monitoring sensor device according to claim 5, wherein according to the heuristic algorithm, $r_{out}$ is 36-38 mm, $r_{in}$ is 45-46 mm, and $\varphi$ is −90°, that is, the TMR magnetic field sensor is located directly under the magnetic shielding ring.

7. The cable condition monitoring sensor device according to claim 1, wherein in the step that the signal-amplifying module amplifies the filtered voltage signal to obtain an output voltage signal and outputs the output voltage signal, the obtained voltage signal is amplified in two stages through a differential amplifying chip.

8. The cable condition monitoring sensor device according to claim 4, wherein the problem of multi-objective optimization of formula (1) is solved with a heuristic algorithm PESA-II so as to determine values of $r_{out}$, $r_{in}$ and $\varphi$.

9. The cable condition monitoring sensor device according to claim 2, wherein in the step that the signal-amplifying module amplifies the filtered voltage signal to obtain an output voltage signal and outputs the output voltage signal, the obtained voltage signal is amplified in two stages through a differential amplifying chip.

10. The cable condition monitoring sensor device according to claim 3, wherein in the step that the signal-amplifying module amplifies the filtered voltage signal to obtain an output voltage signal and outputs the output voltage signal, the obtained voltage signal is amplified in two stages through a differential amplifying chip.

11. The cable condition monitoring sensor device according to claim 4, wherein in the step that the signal-amplifying module amplifies the filtered voltage signal to obtain an output voltage signal and outputs the output voltage signal, the obtained voltage signal is amplified in two stages through a differential amplifying chip.

12. The cable condition monitoring sensor device according to claim 5, wherein in the step that the signal-amplifying module amplifies the filtered voltage signal to obtain an output voltage signal and outputs the output voltage signal, the obtained voltage signal is amplified in two stages through a differential amplifying chip.

13. The cable condition monitoring sensor device according to claim 6, wherein in the step that the signal-amplifying module amplifies the filtered voltage signal to obtain an output voltage signal and outputs the output voltage signal, the obtained voltage signal is amplified in two stages through a differential amplifying chip.

* * * * *